(12) United States Patent
Wu et al.

(10) Patent No.: US 6,811,955 B2
(45) Date of Patent: Nov. 2, 2004

(54) METHOD FOR PHOTORESIST DEVELOPMENT WITH IMPROVED CD

(75) Inventors: Wei-Jen Wu, Tainan (TW);
Sung-Cheng Chiu, Jubei (TW);
Ching-Jiunn Huang, Chang hua (TW);
Cheng-Ming Wu, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 71 days.

(21) Appl. No.: 10/235,185

(22) Filed: Sep. 4, 2002

(65) Prior Publication Data

US 2004/0043329 A1 Mar. 4, 2004

(51) Int. Cl.$^7$ .................................................. G03F 7/26
(52) U.S. Cl. ...................................... 430/311; 430/331
(58) Field of Search .............................. 430/311, 322, 430/331

(56) References Cited

U.S. PATENT DOCUMENTS

| | | | |
|---|---|---|---|
| 4,808,513 A | * | 2/1989 | Lazarus ...................... 430/331 |
| 5,223,377 A | * | 6/1993 | Samarakone ................ 430/330 |
| 6,548,228 B2 | * | 4/2003 | Mutoh ........................ 430/325 |

* cited by examiner

*Primary Examiner*—Kathleen Duda
(74) *Attorney, Agent, or Firm*—Tung & Associates

(57) ABSTRACT

A method for developing a photo-exposed photoresist layer to improve a critical dimension uniformity (CDU) for a semiconductor device manufacturing process including providing a semiconductor process wafer having a process surface comprising a photoresist layer photo-exposed according to an exposure pattern; dispensing a predetermined amount of developer solution over a stationary semiconductor process wafer to form a film of developer solution covering the process surface; partially developing the exposed portions of the photoresist layer comprising maintaining the semiconductor process wafer in a stationary position for a predetermined time period; rotating the semiconductor process wafer for a predetermined period of time to remove a portion of the developer solution; and, repeating the steps of dispensing, partially developing, and rotating, for a predetermined number of repetition cycles to complete a photoresist development process.

21 Claims, 1 Drawing Sheet

METHOD FOR PHOTORESIST DEVELOPMENT WITH IMPROVED CD

FIELD OF THE INVENTION

This invention generally relates to photoresist patterning and more particularly to a photoresist development method for achieving improved critical dimension uniformity (CDU) including improved wafer yield in a photoresist patterning process.

BACKGROUND OF THE INVENTION

Since the introduction of semiconductor devices, the size of semiconductor devices has been continuously shrinking, resulting in smaller semiconductor chip size and increased device density. One of the limiting factors in the continuing evolution toward smaller device size and higher density has been the stringent requirements placed on photolithographic processes as line width and step heights have decreased for device features. As one way to overcome such limitations, various methods have been implemented to increase the resolution performance of photoresists and to increase critical dimension uniformity (CDU) in the photolithographic patterning process.

Typically a photoresist layer is applied to a semiconductor wafer surface, for example, by spin coating a resinous layer over the process surface followed by what is referred to as a 'soft bake' at about 90° C. to drive off solvents and to impart structural stability to the photoresist layer. The photoresist layer is then aligned and exposed to activating light, for example ultraviolet light (e.g., less than about 400 nm wavelength) through a photomask to transfer the mask image to the photoresist layer. The photoresist then typically undergoes a post exposure baking (PEB) process at about 110° C. to improve adhesion and structural stability and smooth out standing wave profiles in I-line photoresists and to initiate catalyzed photoresist reactions in chemically amplified photoresists. The temperature and time period of the PEB process can be critical to CD control of developed photoresist profiles. Temperatures must typically be controlled to within about 0.1° C. to prevent CD variations due to undesirable photoresist chemical reactions.

Following the PEB, a development process is carried out, the development process being the most critical step in accurately reproducing the mask image in the photoresist layer. The soluble portions of the photoresist are dissolved by liquid development chemicals. Since the goal is to accurately control CD features (minimum geometry features) to meet specifications, the development process must be properly controlled to avoid achieve acceptable photoresist profiles. For example, for positive photoresists, for example diazonapthoquinone (DNQ) novolak I-line resists, a solution typically containing tetra-methyl ammonium hydroxide (TMAH) is used as the developer to dissolve the exposed portions the photoresist. The developer may be applied by a variety of methods including continuous spray development where the developer is sprayed onto a spinning wafer and static developing methods such as puddle development where a puddle of developer is formed on the wafer for a period of time to allow for resist dissolution. A number of factors including nozzle spray pattern, wafer rotation speed, developer volume, developer solution normality, developer temperature, and the method of applying the developer are all critical factors in achieving acceptable photoresist profiles.

For example, referring to FIG. 1 is shown exemplary cross sectional views of defective photoresist profiles that may be caused by improper development. For example shown in FIG. 1 is shown a series of conceptual photoresist profiles formed over substrate 10. For example, photoresist profile portion 12 represents underdevelopment of a patterned photoresist profile. Photoresist profile portion 14 represents an incompletely developed patterned photoresist profile. Photoresist profile portion 16 represents an acceptably developed patterned photoresist profile while photoresist profile portion 18 represents an overdeveloped photoresist profile.

For example, according to the prior art, conventional I-line photoresists and photolithographic patterning methods are typically used for patterning larger features, for example upper metal portions such as bonding pads or wide area trench lines having widths of greater than about 1 micron. According to the prior art static development methods such as puddle development have been used with conventional DNQ I-line photoresist to develop larger features.

One problem with the prior art method of developing conventional I-line photoresists according to static methods is that the within wafer and wafer to wafer CD uniformity is frequently unacceptable due to under-development, incomplete development and over-development over portions of the process wafer surface as conceptually represented in photoresist profiles 12, 14, and 18 shown in FIG. 1. For example, frequently a minimum volume of developer is used in puddle development to minimize wafer backside wetting. As a result, small variations in developer volume, for example, insufficient developer volume frequently lead to under-development or incomplete development over portions of the wafer or wafer to wafer non-uniformities. In addition the failure to use an adequate volume of developer leads to formation of a scum layer of residual dissolved photoresist adversely affecting subsequent processes.

There is therefore a need in the semiconductor manufacturing art to develop an improved developing method for photolithographic patterning processes to achieve improved CD uniformity both within wafer and wafer to wafer.

It is therefore an object of the invention to provide an improved developing method for photolithographic patterning processes including conventional I-line photoresist to achieve improved CD uniformity within wafer and wafer to wafer while overcoming other shortcomings of the prior art.

SUMMARY OF THE INVENTION

To achieve the foregoing and other objects, and in accordance with the purposes of the present invention, as embodied and broadly described herein, the present invention provides a method for developing a photo-exposed photoresist layer to improve a critical dimension uniformity (CDU) for a semiconductor device manufacturing process.

In a first embodiment, the method includes providing a semiconductor process wafer having a process surface comprising a photoresist layer photo-exposed according to an exposure pattern; dispensing a predetermined amount of developer solution over a stationary semiconductor process wafer to form a film of developer solution covering the process surface; partially developing the exposed portions of the photoresist layer comprising maintaining the semiconductor process wafer in a stationary position for a predetermined time period; rotating the semiconductor process wafer for a predetermined period of time to remove a portion of the developer solution; and, repeating the steps of dispensing, partially developing, and rotating, for a predetermined number of repetition cycles to complete a photoresist development process.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained with respect to and particularly advantageous for the photoresist development of conventional DNQ I-line Novolak photoresists, it will be appreciated that the method of the present invention may be applied to the development of any positive photoresist where improved CD uniformity both within wafer and wafer to wafer uniformity is desirable. Further, while the method of the present invention is explained with reference to exemplary implementation with the use of exemplary apparatus, it will be appreciated that the method of the present invention is not thereby limited to the use of the exemplary apparatus.

In a first embodiment of the invention, a semiconductor process wafer having a process surface including a photo-exposed photoresist layer is provided. Developer solution is then applied to a static wafer to form a developer layer over the process for a period of time. Preferably, the developer solution is an alkaline solution as is commonly used in the art, for example a solution containing tetra-methyl ammonium hydroxide (TMAH). The process wafer is then rotated for a period of time to remove a portion of the developer layer. The steps of applying the developer solution and rotating the process wafer are then repeated to complete the photoresist development process followed by deionized water rinsing and drying steps.

In one embodiment of the invention the developer solution is applied to a stationery (static) process wafer to form a film of developer solution covering the process wafer. For example, the developer solution is dispensed by a spray or a horizontally moveable member having a solution dispensing opening slit parallel to the process wafer surface.

Figure 1:
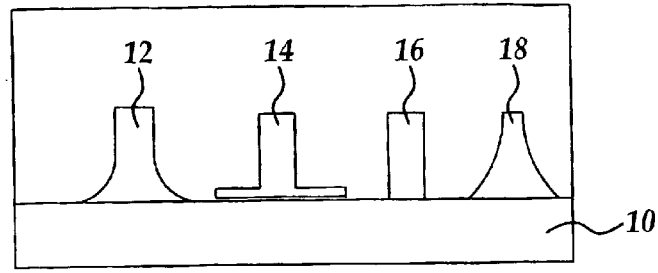
FIG. 1 is a conceptual representation of various patterned photoresist profiles including representative profile and CD variation due to photoresist exposure and development processes according to the prior art.
Figure 2A:
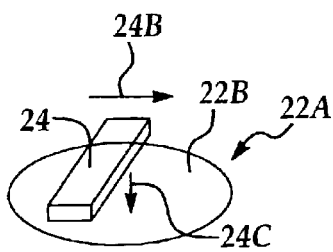
FIGS. 2A–2C are schematic representations of a development process according to an embodiment of the present invention.
Figure 2B:
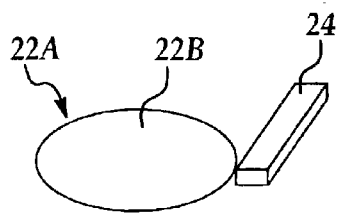
Figure 2C:
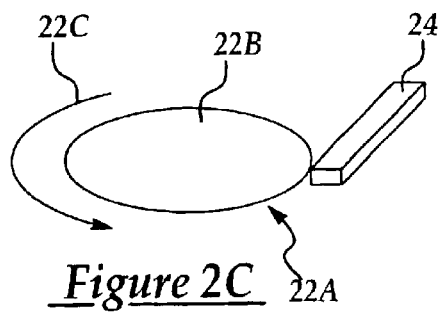

For example, referring to FIGS. 2A through 2C are shown schematic representations of development process steps according to an embodiment of the dynamic development process of the present invention. Referring to FIG. 2A is shown a process wafer 22A having a process surface 22B and showing a portion of the dispensing system with A moveable developer dispensing member 24 being moveably positioned over the process surface 22B. For example the wafer is robotically transferred to various process stations for photolithographic processes, commonly referred to as a wafer track where the wafer is sequentially transferred to adjacent process stations to carry out sequential photolithographic patterning processes including development. For example, at the developer dispensing station, the wafer is mounted on a vacuum chuck (not shown) which is attached to a spindle (not shown) rotatably attached to a motor (not shown) for rotating (spinning) the wafer 22A. In operation, according to an embodiment of the present invention, while holding the wafer 22A stationary (e.g., not rotating), the moveable member 24 moves horizontally as indicated by direction arrow 24B over the wafer process surface to dispense a predetermined volume of the developer solution onto the process surface 22B, the developer dispensing direction indicated by arrow 24C, to form a layer or film of developer solution (not shown) covering the process surface 22B. It will be appreciated that the volume of dispenser will vary with the wafer size, the thickness of the photoresist layer and the type of photoresist. The wafer 22A may optionally be slowly rotated to aid in spreading of the applied developer solution, for example at about 10 to about 20 RPM for less than about 1 second. It will be appreciated that any development dispensing method may be used including, for example, delivering a spray or stream of developer solution from a nozzle positioned over the process surface.

Referring to FIG. 2B, following the formation of the film of developer solution the film (puddle) of developer solution (not shown) is allowed to stand over the stationary process surface 22B for a period of about 1 second to about 5 seconds in a static developing period. In a preferable embodiment, for example, using DNQ I-line photoresist having a thickness of about 6000 Angstroms to about 12000 Angstroms, and feature widths of greater than about 1 micron, the puddle of developer solution is preferably left stationary for a period of about 2 to about 3 seconds.

Referring to FIG. 2C, following the static developing period, the process wafer 22A is rotated indicated for example by directional arrow 22C at an average rotational velocity from about 30 RPM to about 70 RPM, more preferably about 50 RPM, for a period of less than about 1 second, more preferably about 0.4 seconds to about 0.6 seconds. It will be appreciated that for such short rotation periods, only an average rotational speed can be determined since there are acceleration and deceleration components to the rotational period. However, it will be appreciated that the time period and average rotational speed are critical in that the angular momentum developed over the rotational time determines the amount of developer and partially dissolved resist particles discarded over the wafer edge and remaining on the wafer process surface. Since the development of the photoresist continues at a different rate following the rotational period, it is critical to bring the wafer to a stop as quickly as possible and complete another developer dispensing step to begin a new static (puddling) development step in order to maintain predictable and repeatable control over the rate of photoresist development. For example, it is believed that the time periods recited with respect to the preferred embodiments allow for the more uniform developing of the photoresist layer by providing for both an improved consistency in the rate of dissolution of the exposed photoresist while maintaining a consistent developer concentration for uniform dissolution across the wafer process surface.

Following the rotational period, the process wafer is brought to a stationary position and the developer dispensing step, static development step, and wafer rotation step, forming a dynamic process cycle are repeated a predetermined number of cycles to complete the development process. Preferably, the dynamic process cycle is repeated for more than about 10 process cycles, for example, from about 10 process cycles to 20 process cycles. Following the development process, the process wafer is subjected to subsequent steps including edge photoresist bead removal and conventional rinsing and drying steps, for example, a spin-spray rinse process where deionized water is sprayed onto the wafer front and backside surfaces while the process wafer is simultaneously rotated at about 100 to about 1000 RPM, followed by a spin dry process where the wafer is rotated from about 100 to about 1000 rpm to dry the process wafer in the presence of a controlled atmosphere including for example, a flow of nitrogen or inert gas.

Figure 3:
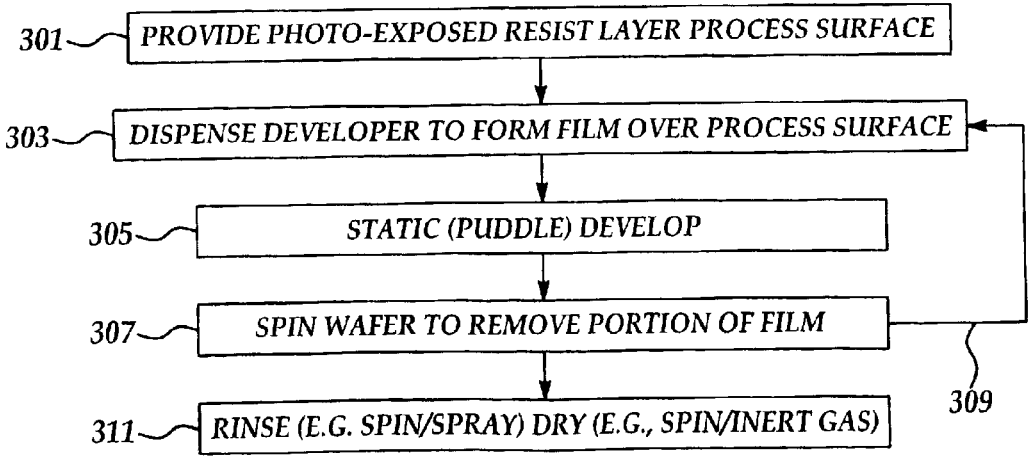
FIG. 3 is a process flow diagram including several embodiments of the present invention.

Referring to FIG. 3 is a process flow diagram including several embodiments of the present invention. In process 301, a semiconductor process wafer including a photo-exposed photoresist layer is provided. In process 303, a film of developer solution is dispensed to form a developer solution film over the stationary process surface. In process 305, a static development or puddling process is performed where the film of developer solution remains over the process surface the process wafer being maintained in a stationary position for about 1 second to about 5 seconds. In process 307, following the static development period, the process wafer is rotated at average rotational rate of about 30 RPM to about 50 RPM for a period of less than about 1 second, more preferably about 0.4 to about 0.6 seconds. Referring to directional process arrow 309, the steps of dispensing, static development, and wafer rotation i.e., processes 303, 305, and 307 to complete a dynamic development process cycle are repeated to include more than about 10 process cycles, preferably from about 10 to about 20 process cycles. In process 311, conventional rinsing and drying steps are performed to complete the photoresist development process.

According to exemplary implementations of preferred embodiments of the present invention, it has been found that in photolithographic patterning steps carried out to form, for example, ion implant layers, and upper metallization layers including a top metallization layer having wide metal areas, for example, having feature widths greater than about 1 micron, that the critical dimension uniformity, both within wafer and wafer to wafer was improved. For example, in an exemplary implementation, the CDU increased by about 20 percent to about 50 percent compared to prior art static development processes. For example, taking a 0.4 micron feature dimension as the critical dimension (CD), it was found that the development process according to embodiments of the present invention achieved an improved statistical measure of CD uniformity (CDU). For example, 3 sigma, or 3 times the standard deviation, a commonly used statistical measure in the art frequently referred to as 3 sigma, was reduced from about 20 percent to about 50 percent according to exemplary embodiments of the present invention compared to the 3 sigma values achieved by development processes according to the prior art, for example static development.

In another exemplary implementation of the present invention, in the formation of a resist pattern for forming an ion implant layer, what is referred to in the art as a 'scum photo window' was increased by about a factor of 2 compared to prior art development processes, for example continuous spray or puddle (static) processes. Generally, in static development processes, for example, a residual layer (scum layer) of dissolved photoresist is formed on the process wafer surface following insufficient developer volume and under development. In addition wafer yield with respect to the photolithographic patterning process was increased from 27 percent to about 34 percent. Further, other commonly used performance benchmarks such as depth of focus (DOF) were found to be improved compared prior art static development methods.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for developing a photo-exposed photoresist layer to improve critical dimension uniformity (CDU) for a semiconductor device manufacturing process comprising the steps of:

providing a semiconductor process wafer having a process surface comprising a photoresist layer photo-exposed according to an exposure pattern;

dispensing a predetermined amount of developer solution over the semiconductor process wafer to form a film of developer solution covering the process surface;

partially developing the photoresist layer comprising maintaining the semiconductor process wafer in a stationary position for a first predetermined time period;

rotating the semiconductor process wafer for a second predetermined period of time to remove a portion of the developer solution; and, repeating the steps of dispensing, partially developing, and rotating, for a predetermined number of repetition cycles to complete a photoresist development process.

2. The method of claim 1, wherein the photoresist comprises an I-line photoresist.

3. The method of claim 1, wherein the step of dispensing comprises contacting the process wafer surface with a stream of the developer solution from a horizontally positioned slit substantially parallel to the process surface.

4. The method of claim 3, wherein the developer solution comprises tetra-methyl ammonium hydroxide (TMAH).

5. The method of claim 1, wherein the developer solution comprises an alkaline solution.

6. The method of claim 1, wherein the step of partially developing comprises the first predetermined time period of about 1 second to about 5 seconds.

7. The method of claim 6, wherein the step of rotating is carried out an average rotational velocity of about 30 RPM to about 70 RPM for the second predetermined period of time of less than about 1 second.

8. The method of claim 7, wherein the average rotational velocity is from about 40 RPM to about 60 RPM and the second predetermined period of time is from about 0.4 seconds to about 0.6 seconds.

9. The method of claim 1, wherein the step of repeating further comprises greater than about 10 repetition cycles.

10. The method of claim 9, wherein the step of repeating further comprises about 10 to about 20 repetition cycles.

11. The method of claim 1, wherein the photoresist development process comprises patterning a metal layer including feature widths of greater than about 1 micron in a multilayer semiconductor device.

12. The method of claim 1, wherein the photoresist development process comprises an ion implant photoresist patterning process.

13. A method for developing a photo-exposed photoresist layer to improve critical dimension uniformity (CDU) for a semiconductor device manufacturing process comprising the steps of:

providing a semiconductor process wafer having a process surface comprising a photoresist layer photo-exposed according to an exposure pattern;

dispensing a predetermined amount of developer solution onto the semiconductor process wafer to form a film of developer solution;

partially developing the photoresist layer comprising maintaining the semiconductor process wafer in a stationary position for a first predetermined time period;

rotating the semiconductor process wafer for a second predetermined period of time and average rotational velocity to remove a portion of the developer solution; and, repeating the steps of dispensing, partially developing, and rotating, for a predetermined number of repetition cycles to complete a photoresist development process.

14. The method of claim 13, wherein the photoresist comprises an I-line photoresist.

15. The method of claim 13, wherein the step of partially developing is carried out for the first predetermined time period of about 1 second to about 5 seconds.

16. The method of claim 15, wherein the first predetermined time period is about 2 seconds to about 3 seconds.

17. The method of claim 15, wherein the step of rotating is carried out an average rotational velocity of about 30 RPM to about 70 RPM for the second predetermined period of time of less than about 1 second.

18. The method of claim 17, wherein the average rotational velocity is from about 40 RPM to about 60 RPM and the second predetermined period of time is from about 0.4 seconds to about 0.6 seconds.

19. The method of claim 13, wherein the step of repeating comprises greater than about 10 repetition cycles.

20. The method of claim 13, wherein the photoresist development process comprises pattering a metallization layer including feature widths of greater than about 1 micron in a multilayer semiconductor device.

21. The method of claim 13, wherein the photoresist development process comprises an ion implant photoresist patterning process.

* * * * *